United States Patent
Brehm et al.

(10) Patent No.: US 9,633,144 B2
(45) Date of Patent: Apr. 25, 2017

(54) METHOD FOR PERFORMING AN INVENTORY OF THE HARDWARE COMPONENTS CONNECTED TO A CONTROL UNIT TEST SYSTEM

(71) Applicant: dSPACE digital signal processing and control engineering GmbH, Paderborn (DE)

(72) Inventors: Thorsten Brehm, Paderborn (DE); Susanne Koehl, Paderborn (DE); Juergen Paule, Altdorf (DE); Juergen Klahold, Brakel (DE); Claus Diener, Wolnznach (DE)

(73) Assignee: dSPACE digital signal processing and control engineering GmbH, Paderborn (DE)

( * ) Notice: Subject to any disclaimer, the term of this patent is extended or adjusted under 35 U.S.C. 154(b) by 290 days.

(21) Appl. No.: 14/185,969

(22) Filed: Feb. 21, 2014

(65) Prior Publication Data
US 2014/0236560 A1 Aug. 21, 2014

(30) Foreign Application Priority Data
Feb. 21, 2013 (EP) .................. 13000867

(51) Int. Cl.
G06F 17/50 (2006.01)
G06G 7/62 (2006.01)
G06F 11/22 (2006.01)

(52) U.S. Cl.
CPC ...... G06F 17/5009 (2013.01); G06F 11/2289 (2013.01)

(58) Field of Classification Search
CPC ...... Y02T 10/82; G05B 23/0208; G06F 17/50
(Continued)

(56) References Cited

U.S. PATENT DOCUMENTS 6,115,774 A 9/2000 Ezawa et al.
6,526,332 B2 2/2003 Sakamoto et al.
(Continued)

FOREIGN PATENT DOCUMENTS

CN 101149622 A 3/2008
CN 101441473 A 5/2009
(Continued)

OTHER PUBLICATIONS

Japanese Office Action for Japanese Application No. 2014-032725 dated Nov. 30, 2015 with partial English translation.
(Continued)

*Primary Examiner* — Eunhee Kim
(74) *Attorney, Agent, or Firm* — Muncy, Geissler, Olds & Lowe, P.C.

(57) ABSTRACT

A method for performing an inventory of the hardware components connected to a control unit test system, wherein control units can be tested with the test system in an environment simulated by the test system by means of a model, and wherein the test system comprises at least one computer) and hardware components that are connected to one another by means of at least one network. For at least a portion of the hardware components, in particular of all simulation-specific hardware components, at least one item of component information that uniquely and digitally identifies the hardware component is read therefrom, and all identifying component information that has been read out is stored.

23 Claims, 2 Drawing Sheets

(58) Field of Classification Search
USPC .................................................. 703/6–8, 13
See application file for complete search history.

(56) References Cited

U.S. PATENT DOCUMENTS

| | | | |
|---|---|---|---|
| 6,622,272 B1* | 9/2003 | Haverkamp | G01R 31/31905 714/724 |
| 6,915,330 B2 | 7/2005 | Hardy et al. | |
| 7,293,117 B2 | 11/2007 | Ohta | |
| 7,933,734 B2 | 4/2011 | Bruski et al. | |
| 8,209,151 B2 | 6/2012 | Gruaz et al. | |
| 8,290,755 B2 | 10/2012 | Bruski et al. | |
| 8,433,953 B1* | 4/2013 | Gaudette | G06F 11/263 702/123 |
| 9,009,013 B2* | 4/2015 | Krainz | G05B 17/02 703/13 |
| 2002/0173879 A1 | 11/2002 | Sakamoto et al. | |
| 2004/0030880 A1 | 2/2004 | Kitagawa | |
| 2005/0034465 A1 | 2/2005 | Borchers et al. | |
| 2006/0282248 A1 | 12/2006 | Kageyama et al. | |
| 2007/0255482 A1* | 11/2007 | Fukuda | G05B 17/02 701/99 |
| 2008/0071935 A1 | 3/2008 | Ohta | |
| 2008/0091279 A1 | 4/2008 | Biermann et al. | |
| 2008/0098068 A1* | 4/2008 | Ebata | H04L 12/58 709/206 |
| 2008/0154957 A1 | 6/2008 | Taylor et al. | |
| 2013/0138942 A1 | 5/2013 | Klose et al. | |

FOREIGN PATENT DOCUMENTS

| | | |
|---|---|---|
| CN | 102262695 A | 11/2011 |
| CN | 202183035 U | 4/2012 |
| CN | 202183045 U | 4/2012 |
| CN | 102520711 A | 6/2012 |
| CN | 102880171 A | 1/2013 |
| DE | 10 2011 087 382 A1 | 6/2013 |
| EP | 1 168 768 A1 | 1/2002 |
| EP | 1 235 168 A2 | 8/2002 |
| EP | 1 806 636 A1 | 7/2007 |
| JP | 62-100957 A | 5/1987 |
| JP | 10-54868 A | 2/1998 |
| JP | 10-63704 A | 3/1998 |
| JP | 11-26095 A | 1/1999 |
| JP | 2002-113675 A | 4/2002 |
| JP | 2004-361292 A | 12/2004 |
| JP | 2005-048764 A | 2/2005 |
| JP | 2006-350549 A | 12/2006 |
| JP | 2007-058433 A | 3/2007 |
| JP | 2009-134699 A | 6/2009 |
| JP | 2009-294745 A | 12/2009 |
| JP | 2010-256354 A | 11/2010 |
| JP | 2011-252805 A | 12/2011 |

OTHER PUBLICATIONS

Japanese Office Action for Japanese Application No. 2014-031584 dated Nov. 30, 2015 with partial English translation.
European Search Report for European Application No. 13000867.5 dated Oct. 11, 2013 with English translation.
Chinese Office Action for Chinese Application No. 201410048606.2 dated Mar. 3, 2016 with English translation.
Chinese Office Action for Chinese Application No. 201410048369.X dated Mar. 30, 2016 with English translation.
Tao Deng, "Hardware-in-the-Loop Simulation Research on Continuously Variable Transmission in Driver-Vehicle-Road Closed Loop System," Thesis for Chongqing University, pp. 1-165 with English translation of pp. 121-127 (pub. Jun. 15, 2011).
Zheng Wei, "Development of New Generation of Hardware-in-the-Loop Simulation Platform," Dissertation for Tsinghua Univ., pp. 1-111 with English translation (pub. Dec. 15, 2011).
Xiaolei Che, "Research on Hardware-in-the-Loop Testing System for Automotive Powertrain ECU," Thesis, pp. 1-132 with English translation (pub. May 15, 2012).
Japanese Office Action for Japanese Application No. 2014-031584 dated Jun. 13, 2016 with English translation.
Extended European Search Report for European Application No. 13156323.1 dated Jan. 3, 2017 with English translation.
U.S. Appl. No. 14/187,847, dated Feb. 24, 2014.

* cited by examiner

| Key: |
|---|
| 2 - simulation architecture |
| 3 - first network |
| 4 – hardware component |
| 5.1 - computer |
| 5.2 – control computer |
| 6 – first gateway |
| 7 – second network |
| 8 – load |
| 9 – independent data connection |
| 10 – second gateway |
| 11 – intelligent node |
| 12 - router |

METHOD FOR PERFORMING AN INVENTORY OF THE HARDWARE COMPONENTS CONNECTED TO A CONTROL UNIT TEST SYSTEM

This nonprovisional application claims priority under 35 U.S.C. §119(a) to European Patent Application No. EP13000867.5, which was filed on Feb. 21, 2013, and which is herein incorporated by reference.

BACKGROUND OF THE INVENTION

Field of the Invention

The present invention relates to a method for performing an inventory of the hardware components connected to a control unit test system, wherein control units can be tested with the test system in an environment simulated by the test system by means of a model, and wherein the test system comprises at least one computer and hardware components that are connected to one another by means of at least one network.

Description of the Background Art

Test systems for performing control unit tests are known in the prior art. For example, control units for motor vehicles can be tested, as well as control units for other devices such as, e.g., automated production equipment such as robots, or even for other transport means, as for example airplanes. All of these devices have largely in common that, in order to function in an error-free manner, they have at least one control unit that acquires environmental data, or data from sensors interacting with the environment, and responds thereto.

In order to verify the (error-free) functioning of control units, a method is used that is also called "hardware-in-the-loop" and in essence dictates that an actual existing electronic control unit is tested, for which purpose this control unit is integrated into a test system that includes at least one computer that simulates a test environment, for example with the aid of a model that is stored and executed therein, and also includes additional hardware components that are connected to one another for the purpose of communication, which can take place, for example, via at least one network, in particular a network designed as a bus.

Examples of typical hardware components, which includes the control unit to be tested itself, include cable harnesses, mechatronic components, actual loads, as well as other electronics required to perform an individual test, for example A/D converters, interfaces, etc.

Especially by means of actual loads, it is possible to take into account in a test that is to be performed that under some circumstances certain environmental conditions, such as external influences on a control unit, may not be provided by a model in a simulation; consequently, in such a case actual, real loads are connected to the test system, for example actuators, sensors, or other data generators, especially actual hardware components of a system into which a control unit is incorporated for its later operation.

One concrete example from the motor vehicle field is the attachment of a throttle valve to the test system, since this component exhibits a behavior that is difficult to impossible to capture in simulation. Other actual loads, such as a steering system or a gas, brake, or clutch pedal, for example, can likewise be connected, even if they are simulatable in principle.

A concrete test can provide, for example, that the inputs of a control unit are simulated with sensor data from a model, or alternatively, if such sensor data cannot be obtained from a model by simulation, are simulated through data from the aforementioned real components.

The reaction to such data by a control unit to be tested can be accomplished by reading back output data of the control unit into the model or the computer executing the model and can thus be checked, which is to say tested. It is an advantage that such a test system can simulate an environment for the control unit to be tested essentially in real time, so that the control unit can be tested as though it were actually installed in the device in which it is intended to be used later. In order to permit real time capability, simulation cycles can have a preferred duration of less than 1 ms.

Potential errors in a control unit can be detected early by means of such a test system, in particular can be reproduced through repetitive simulation sequences, and the correction of discovered errors can be verified, in particular through repetition of the test sequences that led to the error.

It is critical to the error-free function of a test system that the configuration of the test system has also been performed correctly. Such a configuration, which is to say the assembling of the individual hardware components of the test system, is performed largely manually, with the result that susceptibility to errors of the test system itself also results from incorrect hardware components having been integrated in the test system during configuration.

For example, if a certain test, which is to say a certain environmental condition or interaction of a control unit with the simulated environment, is to be tested, an error can be caused simply by the fact that a hardware component is selected that is not suitable for providing the desired environmental condition to be simulated.

For example, if a throttle valve controller for a 6-cylinder engine that is implemented in a control unit is to be tested by means of a test system, it is evident that this test cannot be performed correctly if a 4-cylinder throttle valve is inadvertently connected to the test system as the actual load by a human being configuring the test system.

The susceptibility to error of a manually configured test system can be reduced, for example, if an option is realized for performing an inventory of the hardware components connected to a control unit test system, because such an inventory allows information to be available at all times concerning the actual hardware components that are connected to the test system in question.

To date, any inventorying in the prior art merely provides for a manual compilation of the applicable components in a test system on the basis of the manual configuration of the individual hardware components in the test system. However, this, too, involves the risk of errors on account of the human influence. Moreover, manual compilation is time-consuming and cost-intensive.

SUMMARY OF THE INVENTION

It is therefore an object of the present invention to provide a method for inventorying the hardware components connected to a control unit test system that largely excludes human influences as a source of error, or unambiguously identifies them, thus contributing to higher process reliability as well as fundamental documentation capability.

In an embodiment, a method is to be provided that automatically creates an inventory, and preferably also opens up the possibility of performing configuration tests, consistency tests, and documentation, in particular to preclude or uncover errors that can be attributed to human carelessness. Thus, it should also be ensured that errors occurring during a test can be traced back to a malfunction in the control unit rather than an error in the test system itself.

The problem rooted in the prior art of the erroneous technical configuration of hardware components, in particular the incorporation of hardware components that are not technically suitable in a test system for performing a specific simulation, can be solved in accordance with the invention by the means that, for at least a portion of the hardware components, at least one item of component information that uniquely and digitally identifies the hardware component is read therefrom, and all identifying component information that has been read out is stored.

Accordingly, a concept of the method is based on the idea that in accordance with the invention at least a portion of the hardware components connected to the test system should be uniquely, digitally identified, that such an identifying item of component information is one that can be read directly from the hardware component so that such a readout process can be automated and thus the identifying items of component information read from the individual hardware components can also be collected and stored in an automated manner for performing the inventory.

Provision can be made here that at least all those hardware components that are to be viewed as simulation-specific, which is to say those for which an incorrect installation or incorrect configuration in a test system directly affects the simulation result or the correctness of the test result, are or will be provided with an item of component information that uniquely and digitally identifies the hardware component.

Accordingly, in a test system for performing tests with control units it is certainly possible for hardware components to be present that can be used in general for every type of simulation and test of control units, and thus are not simulation-specific, so that such hardware components are correctly functional in general within a test system regardless of the simulation to be performed.

Consequently, no incorrect configuration or erroneous incorporation into a test system can occur for such hardware components, so that provision can be made if applicable to not include such hardware components in the inventory.

However, at least hardware components that are specifically to be used for a given simulation to be performed are included in the inventory. One example is the throttle valve mentioned at the outset, which represents a hardware component to be categorized as an actual load, and which as a 4-cylinder throttle valve would represent an incorrect hardware component for the individual test of a 6-cylinder throttle valve controller that may be implemented, e.g., in a control unit to be tested. In this example, the key point is thus to achieve a correct pairing within the test system of the control unit and actual load.

Accordingly, it is important to provide a unique, digital identifying item of component information for at least such simulation-specific hardware components if they do not already carry an identifying item of component information that can be used for the purpose of inventorying in accordance with the invention.

The goal of an inventory is achieved according to the invention when the applicable identifying items of component information have all been read out and stored for at least the simulation-specific hardware components. The storage can be accomplished, for example, by the means that the individual identifying items of component information are stored in a memory area of the test system, in particular in a computer of the test system or a control computer connected to the test system.

The storage of the individual identifying items of component information can be accomplished in the manner of a list, for example, so that provision can also be made for generating a file from the individual identifying items of component information that can be stored externally, in particular for the purpose of documentation and validation of process reliability. In accordance with the invention, therefore, at least the simulation-specific inventory is acquired and can be logged using the method.

In this regard, provision can also be made in accordance with the invention for the applicable readout of the identifying component information from the individual hardware components, in particular the simulation-specific hardware components, to take place by means of the computer of the test system that also performs the actual simulation using a model, which is to say a simulation algorithm to be performed that is present primarily on the computer.

Alternatively, it is also possible to read the individual items of identifying component information from the relevant hardware components by means of a control computer connected to the test system, for example a control computer of the type by means of which a software configuration of the test system is performed.

For example, by means of such a control computer the model, which is to say the software simulating a particular environmental condition, can be transferred to the computer of the test system and/or can be provided with parameters required for the simulation. It is likewise possible by means of such a control PC to read results out of the test system and if applicable to visualize them, in particular for monitoring of the test system by users. The inventory, which is to say a list reflecting the stored identifying component information, can also be visualized by means of this control computer.

A further development in accordance with the invention of the method can provide for the identifying component information that has been read out and stored to describe a technical actual configuration of the test system.

An actual configuration of this type can be implemented in the form of a table, for example, which is present in a memory area of the computer of the test system or the control computer connected thereto, or in the form of a file, stored on a data medium or mass storage for example, that is available for use by one of the said computers. Accordingly, such a technical actual configuration can be assembled from the individual component information items identifying the hardware components, with the component information items being written into this aforementioned memory area or the said file, e.g., in a sequentially numbered order.

In an embodiment of the invention, such a writing into a table/list, and consequently creation of a technical actual configuration, can be performed at least once, for example, in particular at least once before performing a test.

Independently of the time of creation, provision can be made to compare the created actual configuration with a nominal configuration of the test system, for example one that is created during the design of the test system. For example, users of the test system can likewise assemble the identifying component information for the hardware components required for a simulation into a nominal configuration in the form of a table to be stored in a memory area or a file, so that the possibility is created according to the invention to perform a comparison by automation, for example by means of the computer of the test system or the connected control computer, between the required nominal configuration of the test system and the automatically acquired actual configuration present; this can be accomplished by the means that the individual entries of the identifying component information stored in the memory areas or the relevant files on a data medium are compared with one another, for example.

Such a comparison can be performed, for example, by the means that a configuration entry that, as described above, is composed of a digital identifying item of component information for a specific hardware component, is repeatedly read out of the actual configuration generated automatically in accordance with the invention, and a test is made by comparison as to whether this same identifying item of component information is also present in the stored nominal configuration.

If such a comparison is completed with a positive result, the method in accordance with the invention determines by this means that a hardware component that is permissible for the desired simulation is installed in the test system. In contrast, if the comparison is completed with a negative result, which is to say that the digital identifying item of component information present in the actual configuration is not found in the nominal configuration, then this negative result has the consequence that a hardware component that is not permissible for the simulation to be performed is installed in the test system.

Accordingly, a corresponding notification can take place in the event of such a negative comparison, for example by the computer of the test system or the control computer connected thereto, so that operating users are automatically made aware of this error and this error can be corrected by replacing the hardware component. For this purpose, the identifying item of component information for the relevant hardware component, or a clear text associated therewith, can be visualized.

Because of the fact that hardware components installed in typical networks have an identification that is associated with this hardware component in the network used, in other words that represents a network address or a bus address, for example, another embodiment of the method can also provide that, in addition to the aforementioned digital identifying item of component information, just such identification associated with the component for its use in the network is taken into account in both the actual and nominal configuration, and in particular in a table containing the relevant configuration entries in each case, which is to say is stored therein.

In this way, through comparison of nominal and actual configurations on the basis of the identifying component information and the identification in the network, not only is it possible to check whether an installed hardware component is correctly installed with regard to its technical properties, which is to say it is a technically permissible component, but it is also possible in practice to check the installation location.

For example, provision can be made to address a relevant hardware component via the network for such a check, which is to say to prompt it to communicate, for example via the computer of the test system or the aforementioned control computer, wherein this hardware component also sends through the network its identification that is assigned in the network, so that this network identification of the hardware component can be acquired as part of such a communication. To the extent that a digital identifying item of component information from a hardware component can be read out from the hardware component through the same network in which the hardware component is integrated for the purpose of the simulation or for performing the test, provision can be made to read the digital identifying item of component information and the identification that the hardware component carries in the network from a relevant hardware component in the same communications step.

In contrast, if the digital identifying items of component information cannot be read out from a hardware component through the same network in which the hardware component is integrated for the purpose of performing the simulation, provision can be made according to the invention to acquire the identification of a relevant hardware component in the network and the digital identifying item of component information through separate communications processes and to associate them with one another, which is to say to read them from the relevant hardware component and then store these two items of information as an actual configuration, for example by combining these two items of information in a table that in accordance with the above-described embodiment is stored in a specific memory area or in a file in a mass storage unit of the computer of the test system or of the control computer connected thereto.

It is an important advantage of the method according to the invention that it is possible to perform the above-described inventory and, if applicable, the checking between the actual configuration and the required nominal configuration before the first execution of a test of a control unit as part of a simulation, so that the error-free configuration of a test system can be tested, and if applicable documented as well, at least at the start of a test, for example by storing the acquired actual configuration and verifying it by, if applicable, additionally storing the comparison results, in particular wherein these applicable items of information are stored in an externally retained file for the purpose of checking at a later time.

Advantageously, however, the method according to the invention also opens up the possibility to create the actual configuration and, in particular, also to compare the actual configuration with a nominal configuration, not only once, but repeatedly, preferably in a cyclically repeating manner.

Accordingly, by means of such a cyclically repeating performance, it is possible in a simple manner to recheck whether the actual configuration changes over the course of time, which can occur by the means that users who configure the test system make changes therein, for example, with the result that every change that may have been made can not only be inventoried and hence documented, but can also be checked by means of the above-described comparison between actual and nominal configurations.

In an embodiment, provision can also be made here to carry out such a repetition, in particular cyclic repetition, at the run time of a test in order to thus ensure that the test conditions, in particular the hardware required for the performance of a test, do not change, or change only in a permissible manner, during the run time.

An embodiment of the method in accordance with the invention can provide that a digital identifying item of component information is read out of an aforementioned hardware component from an electronic component provided for the function of the hardware component during a test, such as a chip or processor for example.

Thus, it is possible here to utilize the circumstance that electronic components, such as the said chips or processors for example, have already been provided by the manufacturer with information identifying this particular electronic component, as for example a serial number, so that even in the case of mass production such electronic components each contain their own identifying information, which can then be read from such an electronic component by an electronic device, for example through communication via a network or a bus, and can be used in accordance with the invention as a digital identifying item of component information of the particular hardware component in which such an electronic component is installed.

Moreover, in an embodiment the electronic component provided here for function during a test is a component of this type that is used concretely in the relevant hardware component during the performance of a test. This is the case, for example, for a processor on which process steps are carried out during the execution of a test, or also for a chip that represents a memory area from which data are read during the test or into which data are written during the test, and which is thus concretely used for a test during the performance of the test.

Another embodiment, which can also be combined with the foregoing embodiment, can provide that a digital identifying item of component information for a hardware component is read from an electronic component that is not required for the function of the hardware component during a test, such as a chip, for example, wherein such an electronic component is accordingly located on the hardware component for the purpose of providing an identifying item of component information, and thus in one possible embodiment has no function other than to carry or contain the identifying item of component information for readout and otherwise has no additional function at least for the execution of a test as part of a simulation, or in other words does not participate in the test itself.

In this embodiment, it has proven to be advantageous that hardware components that originally cannot be uniquely identified, for example because they have no electronic components that already have their own identification, can be specifically equipped for the purposes of the method in accordance with the invention, for example by attaching an additional electronic component to the hardware component, in order to then read out the digital identifying item of component information from this electronic component, in particular as a representative for the hardware component from this electronic component, and to use the data as part of the inventory and, if applicable, the above-mentioned comparisons.

Accordingly, there arises an economical option for retrofitting hardware components that are already present for test purposes but that were heretofore not digitally identifiable and become digitally identifiable through the attachment of an appropriate electronic component.

Another embodiment of the method in accordance with the invention can also provide here that a hardware component that does not have its own electronic component carrying at least one identifying item of component information is connected to a hardware component that does have an electronic component of its own carrying at least one identifying item of component information, thereby connecting the two hardware components to form a new unit, in particular a unit of this type that cannot be separated nondestructively.

This can be accomplished by means of a screwed or sealed connection between the two hardware components, for example. Accordingly, as a result of the presence of a digital identifying item of component information on at least one hardware component of the newly formed unit, the entire new unit can be digitally identified. Of course, it is also possible here to combine more than two hardware components into a unit, wherein at least one of these multiple hardware components then includes an electronic component of its own with an identifying item of component information, from which the entire unit assembled from multiple hardware components then profits, or in other words can be identified by this means.

Provision can also be made when carrying out the method in accordance with the invention that a portion of the hardware components of the test system is connected, for example to a first bus on the computer of the test system, by means of a first network, and that a (different) portion of the hardware components of the test system, such as a control unit to be tested and/or actual loads, is connected, for example to a second bus on the computer of the test system, by means of a second network, wherein the two networks, in particular the buses used, are connected by means of a gateway, thus exploiting the possibility of transmitting signals or data on one of the two networks to the other respective network or to the other bus, in particular wherein such a gateway can undertake, for example, a protocol transformation if the two networks or buses work with a different communications protocol.

For example, provision can be made here for a network to be employed as the first network that is used as proprietary by a manufacturer of at least the computer of the test system and, if applicable, also of mandatory components, in particular non-simulation-specific components, provided for the test system, whereas in contrast a network that may possibly be standardized can be used as a second network in order to connect additional components, in particular external components, such as the aforementioned control units or external (actual) loads to the computer of the test system through such a network or a standardized bus.

As an example, the network or the bus IOCNET from the applicant of this invention can be used for a first network, while e.g. the CAN bus established in the automotive industry can be employed as the second network. It must be noted that the invention described herein is not limited to the specific networks or buses mentioned herein, but instead other networks or buses can of course also be employed.

Due to the use, as described, of a gateway to connect the at least two networks, it is possible to ensure in this way that even identifying component information from hardware components connected to the second network can be read out directly through the second network by a given hardware component and, for example, transmitted through the gateway, in particular a first gateway, to the first network, in particular the network in which the computer of the test system is located so that the identifying component information is available at least to this computer for the purpose of inventorying and/or performing the aforementioned comparisons, or can also be transmitted over this network to a control computer connected to the test system for the same purpose. This presupposes that an electronic component, whether it be original equipment or retrofitted, is connected to at least one of the at least two said networks (buses).

If, in contrast, an identifying item of component information cannot be read from a hardware component that is integrated in the test system either through the aforementioned first network or through the aforementioned second network, which can be the case, for example, if what is involved is a hardware component on which is located, for the purpose of providing an identifying item of component information, an electronic component of no significance for the function of the hardware component during a test, then provision can also be made here to communicate the applicable identifying item of component information over an independent data connection in each case, which is to say an individual data connection for each particular hardware component under consideration, and to then forward the data to be read out onto the second network, or alternatively directly onto the first network.

If applicable, provision can also be made here by means of the above-described individual data connection to perform direct forwarding, bypassing all network communication, to a computer, in particular that of the test system, or to the control computer, which then performs the inventorying according to the invention, which is to say the collection and storage of at least the digital identifying items of component information, and if applicable the above-described comparisons as well.

In an embodiment, the aforementioned data connection can be implemented as a one-wire bus, for example, between the relevant electronic component and a gateway, in particular a second gateway, if the data connection takes place to the second or first network. A data connection can be carried out without a gateway in the case of direct forwarding to one of the aforementioned computers.

In the case of forwarding of the data, which is to say the digital identifying items of component information, to one of the two networks by means of a gateway, preferably to the second said network, such as the CAN bus for example, provision can be made here by means of at least one gateway, in particular at least one second gateway, for the data from multiple one-wire buses of the electronic components of different hardware components that are present physically in parallel at ports of the at least one, preferably second, gateway to be converted into data that can be read out at different addresses of the second or first network, wherein each of the different addresses is associated with exactly one port of the at least one, preferably second, gateway, and preferably wherein the addresses are arranged in a numerical sequence of the ports.

Such an embodiment exploits a technically simple opportunity for making the digital identifying items of component information available in one of the networks, preferably the second network, as for example a CAN bus, or for reading the items out from the electronic components of the different relevant hardware components over this network, in particular a CAN bus, because according to the method, in such an embodiment the data content is essentially read at an address of the network associated with a particular port, and the digital identifying item of component information, which is forwarded to this address by way of the aforementioned particular port, can accordingly be read directly from this address.

Especially in the case of a numerically specified sequence of the ports and a similarly numerically ordered assignment of addresses to these ports, the majority of the ports available at the gateway, and thus the identifying items of component information for the relevant hardware components present at these ports, can be read by a simple querying of successive addresses at an interval.

The identifying items of component information for all hardware components connected to the test system through such a one-wire bus are thus available in the network, which is connected to the aforementioned gateway, in particular second gateway, thus in particular in the second network and in a preferred embodiment in a CAN bus.

Instead of the aforementioned direct reading in of the identifying items of component information over the data connection and preferably the one-wire bus between the electronic component and the computer while bypassing the possibly multiple networks present in which the individual hardware components communicate with one another during the performance of a test, provision can also be made to supply a third network for the transmission and readout of the identifying items of component information that is not used for the simulation of a test environment in the test system, and thus is used essentially exclusively for the communication of the identifying items of component information.

In this way, by means of such a third network, the identifying items of component information can also be transmitted to the computer of the test system or to a control computer connected to the test system in order to alternatively perform the inventory and if applicable the comparisons using one of these two computers. To this end, the computer used is also to be connected to this third network.

The embodiment using such a third network, or else using the aforementioned direct connection of the electronic components to one of the two computers, is advantageous because the act of performing the inventory in accordance with the invention and the potential comparisons does not disrupt a simulation, which is to say that it does not disrupt a test of a control unit, even if the inventorying is carried out during the run time of a test, in particular cyclically.

Real-time requirements on the test system can thus be adhered to continuously during performance of a test without difficulty, without the need to be concerned about influence by the inventorying in accordance with the invention or the comparisons.

However, another embodiment can also provide that inventorying, and if applicable also a comparison, is also performed multiple times during the run time of a test, but this is not undertaken cyclically, which is to say at repeating identical time intervals, but instead the inventorying or comparison is performed during communication pauses on the at least one network participating in a test.

If such communication pauses are not long enough to perform a complete inventorying within one such pause, provision can be made to partially perform the inventorying within each such pause, which is to say for example to perform at least one readout step with regard to an identifying item of component information for a specific component and to thus perform the complete inventorying over multiple successive communication pauses until the relevant component information has been read out and stored from all hardware components connected to the test system, at least all simulation-specific hardware components connected thereto, wherein, if applicable, the aforementioned comparisons between actual and nominal configurations can also be performed within communication pauses, possibly also step-by-step.

Communication pauses preferably are understood to be those times at which no data packets belonging to the simulation are communicated on the at least one network used, in particular the bus systems used.

Especially when time management is provided in a network, which is performed by, e.g., a hardware component connected to the network, for example the computer of the test system, it is possible to determine when time slots that are not used for the test itself are available on the network during the performance of a test, so as to then perform the communication of the digital identifying items of component information in these time slots, in particular without influencing the real-time capability of the test performed.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
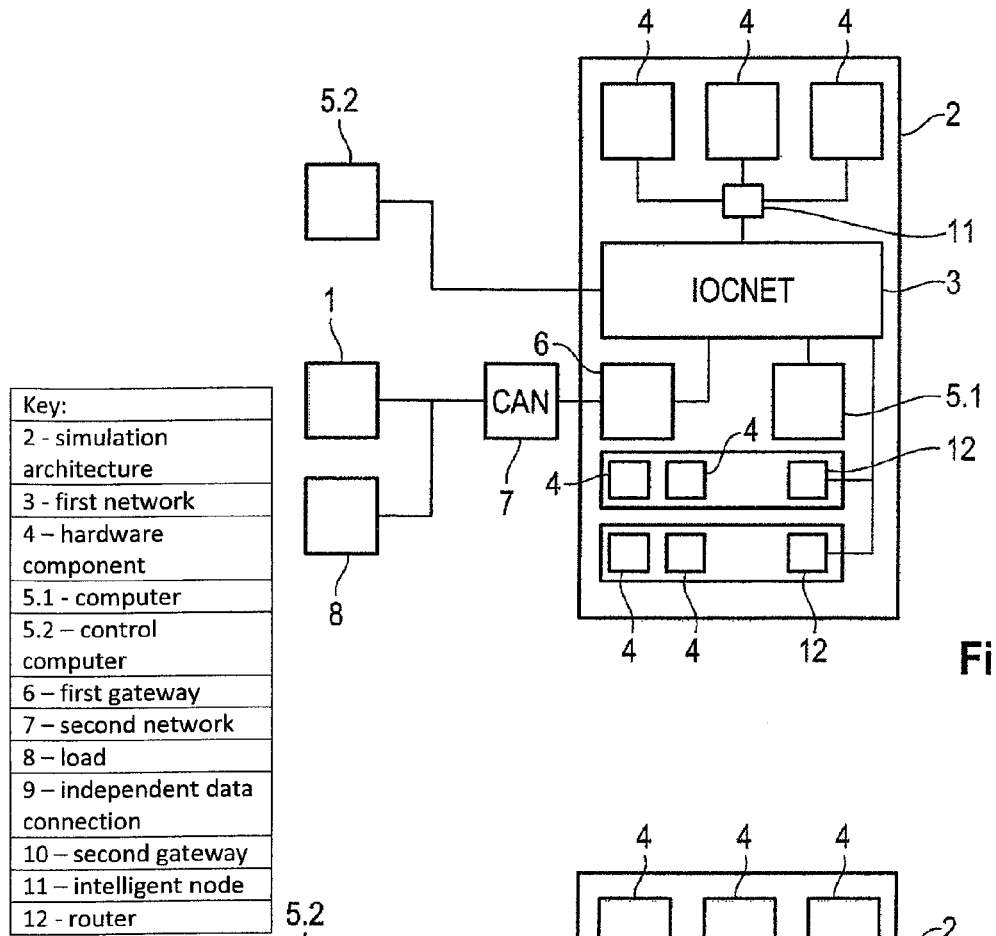
FIG. 1 shows a block diagram of a test system according to can embodiment.

FIG. 1 shows, in an overall view in the form of a block diagram, a test system for performing a test of a control unit, in which an environment is simulated for a control unit 1 by means of a simulation architecture 2, in particular an environment such as is also present in the actual use of the control unit 1 in a later device, as for example a motor vehicle.

The simulation architecture 2 can already comprise multiple hardware components, for example a computer 5.1 of the test system, and can be implemented, for instance, through a proprietary system of a particular manufacturer. In the present case, a system of the patent applicant is shown in which multiple hardware components 4 communicate with one another over a first network 3, and in which a test environment is simulated with the aid of a model by these hardware components and by a computer 5.1, which also performs the inventorying method according to the invention. Here, the hardware components 4 can be incorporated in the network 3, e.g. through intelligent nodes 11 or routers 12, in particular if they do not themselves have suitable network interfaces.

Provision can be made here for a control computer 5.2 to also be provided that is connected to the test system through the same first network 3, for example in order to parameterize the test system or to load and start the requisite software or a model, or to communicate with the test system for other reasons.

The concrete embodiment described here shows that the test system, or specifically the part of the proprietary simulation architecture, has a gateway 6, in particular a gateway 6 hereinafter referred to as a first gateway, wth which it is possible to connect additional external components, namely the control unit 1 under test and if applicable additional actual loads 8 such as are cited at the outset in the general section of the description, to the proprietary hardware architecture through a standardized second network 7, in the present case a CAN bus, in order to form the complete test system.

Such a (first) gateway (6) need not necessarily be implemented as a separate hardware component in the test system, but instead can also form a part of another hardware component, for example a part of the computer (5.1) or the computer (5.2). Accordingly, all components can communicate through the two networks 3 and 7 and thus a test can be performed.

Provision is made here for the method in accordance with the invention that the computer 5.1 of the test system, which in this example performs the so-called inventory management, which is to say performs the method in accordance with the invention, reads digital identifying items of component information, which can be implemented as, e.g., a serial number, for example a 64-bit serial number of electronic components on/in the relevant hardware component, from the individual hardware components, and specifically from at least the simulation-specific hardware components, as for example the control unit 1 and the loads 8, as well as simulation-specific hardware components 4 that may be provided in the simulation architecture 2.

It is a matter of course that it is also possible here in accordance with the method to read such identifying items of component information from those components that are not simulation-specific but should nonetheless be acquired as part of the inventorying for the purpose of satisfying the process reliability of possible documentation.

Since the external hardware components 1 and 8 in this embodiment from FIG. 1 are connected to the first network 3 of the test system through the second network 7, such as a CAN bus, for example, and through a gateway 6, provision is accordingly made here as well to transmit the digital identifying items of component information from the second network through the first gateway 6 into the first network and thus to the computer 5.1 of the inventory management. Identifying items of component information from components on the network 3 are read out from the components directly through this network if such readout is considered necessary, which is to say in particular in the case of components on the network 3 that are likewise simulation-specific.

As described above, the computer 5.1 can collect and store the identifying items of component information that have been read in, for example for purposes of documentation, or can also compare them with a nominal configuration that is predefined by a user and is made available by the control PC 5.2 connected to the test system, for example.

Alternatively, instead of the comparison in the computer 5.1 of the test system, this comparison can also take place in the control computer 5.2 connected to the test system, to which end the collected inventory information, which is to say the information concerning all items of digital component information read out from the individual hardware components, is transmitted to the control computer, here again through the first network 3.

Figure 2:
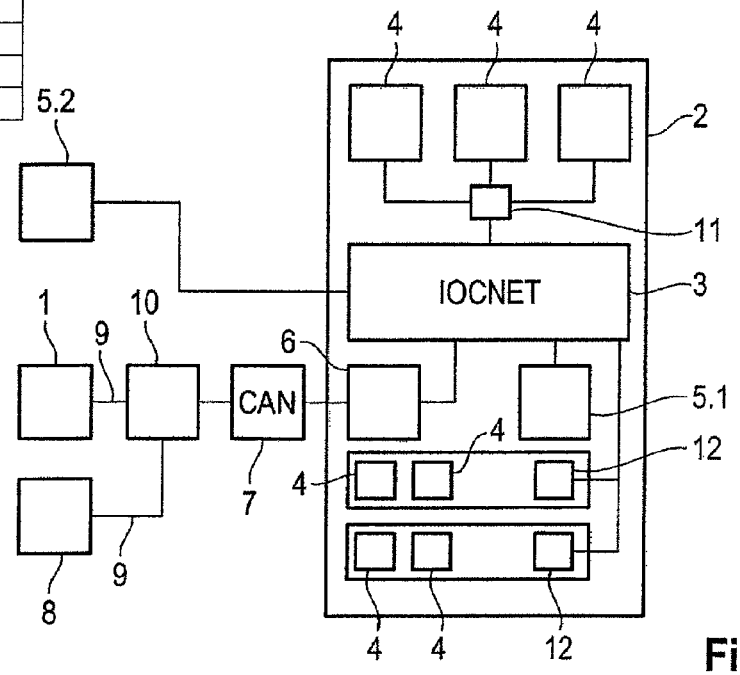
FIG. 2 shows a block diagram of a test system according to an embodiment.

The second embodiment as shown in FIG. 2 illustrates a slightly altered application, where in the present case the digital identifying items of component information are not read in directly from all hardware components through the first or even the second network; instead, for at least a portion of the hardware components, in this example the control unit 1 and actual loads 8, the identifying items of component information are read in over an independent data connection 9 in each case, for example a one-wire bus, so that in this embodiment a second gateway 10 can be used to transmit the digital identifying items of component information present on the one-wire bus or the separate data connection 9 to the second network 7 in this example, for example the CAN bus, or make it available thereon. This embodiment is provided, in particular, when the identifying items of component information are maintained in separate electronic components of the hardware components that do not themselves participate in the test and hence also do not communicate on one of the networks used for the test.

Figure 3:
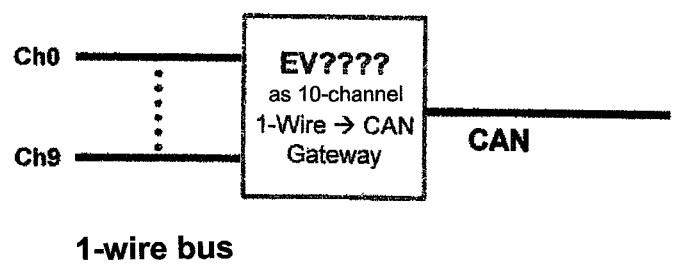
FIG. 3 shows an exemplary embodiment of a gateway.

FIG. 3 shows an example embodiment of the gateway 10, which can be implemented with the use of the EV1097 controller, for example, where each of the input ports 0 to 9 thereof, here designated CH0 to CH9, is connected to a one-wire bus of an electronic component of a hardware component, in particular an electronic component that is provided in order to provide a digital item of component information on the hardware component, for which purpose a one-wire EEPROM, for example of the type DS2431, can be used.

Such an EEPROM can provide a 64-bit serial number that can be transmitted over a one-wire bus and can be used for identification of the hardware component that carries this electronic component, which is to say this EEPROM.

FIG. 3 now illustrates that a physical conversion of the data, which is to say the digital identifying items of component information, at the ports CH0 to CH9 to the second network 7, and here preferably to a CAN bus, is performed by means of the second gateway 10, so that in essence this second network forms an N-to-1 multiplexer in which N ports, in the present case ten different ports or channels, are transmitted on one bus onto which the contents of the ports, which is to say the digital items of component information thereon, are forwarded in successive addresses of an address interval corresponding to the interval width of the number of ports.

Consequently, by reading from successive addresses of this relevant interval in the network 7 or a CAN bus, the totality of all hardware components connected to this second network 7 can be acquired with regard to their respective digital identifying items of component information.

In the case of a number of hardware components that exceeds the number of ports of a second gateway 10, provision can accordingly be made to use multiple gateways 10 that forward their respective ports to mutually non-overlapping address regions of the second network, in particular the CAN bus, in particular to addresses in adjacent intervals that adjoin one another without gaps.

Independently of the concrete embodiments of FIGS. 1 to 3 shown here, provision can be made for the control computer 5.2 connected to the test system to have a nominal configuration of the test system, in particular created by a user and if applicable also created in an automated manner, wherein this nominal configuration includes at least a listing of the identifying component information of approved hardware components required or permitted for performing a test.

Since the method in accordance with the invention provides for reading out the respective identifying digital component information from the hardware components, as for example serial numbers of the electronic components located thereon, and producing an actual configuration from the information that has been read, for which purpose this information is collected in, e.g., a table, for example in a memory area or a file, a comparison in accordance with the invention of the actual configuration and the nominal configuration can take place, and the actual configuration can be stored for purposes of documentation, and in addition the comparison results that may be present can be stored for purposes of documenting the error-free configuration.

If discrepancies between the actual and nominal configurations should arise during the comparison, they can be displayed immediately, for example by communicating the comparison results to the computer 5.2 if the latter does not perform the comparison itself. Corrective action can accordingly be taken on such a comparison result, for example by replacement of a hardware component with a component approved for the relevant test.

For performing the communication and accordingly the collection of the individual identifying items of component information, it is irrelevant whether the data packets containing the identifying items of component information that are transmitted as part of the respective communication take place on request from the computer 5.1 in the test system or on request of the computer 5.2 in the test system, or whether the individual hardware components transmit the items of individual component information on their own initiative and the transmitted items of individual component information, or the communication packets containing them, are collected by one of the two computers as part of the method in accordance with the invention.

What remains as essential for the invention as distinct from the prior art is that errors arising within a test system due to human shortcomings can be detected even before performing a test, can preferably be checked during performance of a test, and thus exploit the possibility of recording the specific actual configuration and storing it for a later run as part of a quality assurance system.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for performing an inventory of hardware components connected to a control unit test system, the method comprising:
   testing control units with the control unit test system in an environment simulated by the control unit test system via a model, the test system comprising at least one computer and the hardware components that are connected to one another via at least one network;
   reading out, for at least a portion of the hardware components or all simulation-specific hardware components that are required in a simulation, at least one item of component information that uniquely and digitally identifies each of the hardware components respectively, the at least one item of component information being a digital identification number that is different for each of the hardware components, such that all of the hardware components, including hardware components having a same configuration as one another, have a different digital identification number; and
   storing all of the identifying component information that has been read out,
   wherein an identifying item of component information for at least one of the hardware components is read out from an electronic component that is not required for a function of the at least one the hardware components during a test, and
   wherein the electronic component is located on the at least one of the hardware components for the purpose of providing an identifying item of component information.

2. The method according to claim 1, wherein the readout of the identifying component information is accomplished by a computer of the test system or by a control computer connected to the test system.

3. The method according to claim 1, wherein the identifying component information that has been read out and stored describes a technical actual configuration of the test system in a form of a table, which is compared with a nominal configuration that is created and stored during a design of the test system through a comparison of applicable configuration entries, and wherein the comparison is performed by a computer of the test system or a control computer connected to the test system.

4. The method according to claim 1, wherein, in actual and nominal configurations in a table containing relevant configuration entries, an identification of the hardware components is taken into account that is associated therewith in the network used or that corresponds to a network address or a bus address in the network used and is included in a transmission over the network during communication with the hardware components, and wherein a check is made through comparison of the actual and nominal configurations using the identifying component information and the identification as to whether installed hardware components are correctly installed with respect to technical properties of the hardware components and the installation location.

5. The method according to claim 1, wherein a creation of an actual configuration and a comparison with a nominal configuration are repeated during a run time of a test, cyclically or during communication pauses occurring on the at least one network used.

6. The method according to claim 1, wherein a first hardware component that does not have an electronic component carrying at least one identifying item of component information is connected to a second hardware component that does have an electronic component carrying at least one identifying item of component information, and the first and second hardware components form a new unit, and are screwed or sealed together, such that the new unit cannot be separated nondestructively.

7. The method according to claim 1, wherein a portion of the hardware components of the test system is connected via a first network or to a first bus on the computer of the test system, and wherein a portion of the hardware components of the test system or a control unit to be tested and/or actual loads is connected via a second network or to a second bus and a gateway connecting networks or buses.

8. The method according to claim 7, wherein identifying component information is read from hardware components connected to the second network, and on the hardware components connected to the second network is located, for the purpose of providing an identifying item of component information, an electronic component that is not required for a function of the hardware components during a test, by an independent data connection in each case, the data of which are forwarded to the second network by at least one gateway.

9. The method according to claim 7, wherein identifying component information is read from hardware components connected to the second network, and on the hardware components connected to the second network is located, for the purpose of providing an identifying item of component information, an electronic component that is not required for a function of the hardware components during a test, by a third network that is not used for the simulation of a test environment and is transmitted into the computer of the test system or a control computer connected to the test system.

10. The method according to claim 7, wherein the gateway is a first gateway on the computer of the test system.

11. The method according to claim 8, wherein the data connection is implemented as a one-wire bus between the electronic component and the gateway.

12. The method according to claim 8, wherein the at least one gateway is a second gateway.

13. The method according to claim 11, wherein, via at least one second gateway, the data from multiple one-wire buses of the electronic components of different hardware components that are present physically in parallel at ports of the at least one second gateway are converted into data that is read out at different addresses of the second network, and wherein each of the different addresses is associated with exactly one port of the at least one second gateway, and wherein the addresses are arranged in a numerical sequence of the ports.

14. The method according to claim 11, wherein the gateway is a second gateway.

15. The method according to claim 1, wherein an electronically readable serial number of an electronic component is used as identifying component information.

16. The method according to claim 15, wherein the electronically readable serial number is a 64-bit serial number.

17. The method according to claim 1, wherein the electronic component that is not required for the function of the hardware components during the test is a chip.

18. The method according to claim 1, wherein the at least one network includes a first network and a second network, and wherein a portion of the hardware components of the test system and a control unit to be tested are connected to the second network and the second network is connected to the first network via a gateway.

19. The method according to claim 1, further comprising a first gateway and a second gateway,
 wherein the at least one network includes a first network and a second network, and
 wherein a portion of the hardware components of the test system and a control unit to be tested are connected to the second network via the second gateway and the second network is connected to the first network via the first gateway.

20. The method according to claim 1, wherein the network is a CAN bus.

21. The method according to claim 1, wherein the electronic component is a chip and the identifying item of component information is a digital identification number.

22. The method according to claim 1, wherein the gateway comprises at least two input ports, each input port being connectable to an electronic component, associating different addresses with each input port.

23. A method for performing an inventory of hardware components connected to a control unit test system, the method comprising:
 testing control units with the control unit test system in an environment simulated by the control unit test system via a model, the test system comprising at least one computer and the hardware components that are connected to one another via at least one network;
 reading out, for at least a portion of the hardware components or all simulation-specific hardware components that are required in a simulation, at least one item of component information that uniquely and digitally identifies each of the hardware components respectively, the at least one item of component information being a digital identification number that is different for each of the hardware components, such that all of the hardware components, including hardware components having a same configuration as one another, have a different digital identification number;
 wherein an identifying item of component information for at least one of the hardware components is read out from an electronic component that is not required for a function of the at least one the hardware components during a test, and wherein the electronic component is located on the at least one of the hardware components for the purpose of providing an identifying item of component information,
 associating an address with an input port of a gateway;

connecting the electronic component to the input port of the gateway;
transmitting, by means of the gateway, an identifying item of component information from the electronic component onto the network;
storing the address and the component information in a table describing an actual configuration of the test system; and
comparing the actual configuration with a nominal configuration of the test system.

* * * * *